United States Patent
Ohta et al.

(10) Patent No.: US 9,175,834 B2
(45) Date of Patent: Nov. 3, 2015

(54) GLASS CERAMIC BODY, SUBSTRATE FOR MOUNTING LIGHT EMITTING ELEMENT, AND LIGHT EMITTING DEVICE

(71) Applicant: ASAHI GLASS COMPANY, LIMITED, Chiyoda-ku (JP)

(72) Inventors: Seigo Ohta, Tokyo (JP); Masamichi Tanida, Tokyo (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 13 days.

(21) Appl. No.: 14/176,285

(22) Filed: Feb. 10, 2014

(65) Prior Publication Data

US 2014/0153262 A1    Jun. 5, 2014

Related U.S. Application Data (63) Continuation of application No. PCT/JP2012/069751, filed on Aug. 2, 2012.

(30) Foreign Application Priority Data

Aug. 8, 2011    (JP) .................................. 2011-172889

(51) Int. Cl.
*C03C 10/00*    (2006.01)
*F21V 21/00*    (2006.01)
(Continued)

(52) U.S. Cl.
CPC .................. *F21V 21/00* (2013.01); *C03C 3/091* (2013.01); *C03C 3/093* (2013.01); *H01L 23/15* (2013.01);
(Continued)

(58) Field of Classification Search
CPC .... C03C 14/00; C03C 14/002; C03C 14/004; C03C 2214/20
USPC ...................................................... 501/2–10
See application file for complete search history.

(56) References Cited

U.S. PATENT DOCUMENTS 6,018,167 A * 1/2000 Oota ............................... 257/99
6,316,086 B1 * 11/2001 Beier et al. ................. 428/293.4
(Continued)

FOREIGN PATENT DOCUMENTS

JP            9-71472       3/1997
JP        2002-111210       4/2002
(Continued)

OTHER PUBLICATIONS

International Search Report issued Sep. 18, 2012 in PCT/JP2012/069751 filed Aug. 2, 2012.
(Continued)

*Primary Examiner* — Noah Wiese
(74) *Attorney, Agent, or Firm* — Oblon, McClelland, Maier & Neustadt, L.L.P.

(57) ABSTRACT

To provide a glass ceramic body, whereby light which transmits through the substrate and leaks (i.e. emits) out of the incident direction is reduced, and the number of voids at the surface of the substrate and in the inside of the substrate is low, A glass ceramic body 10 comprising a glass matrix 11 and flat fillers 12 dispersed therein, wherein the flat fillers 12 are dispersed in the glass matrix 11 so that their individual thickness directions would be substantially in the same direction; and in a cross-section along the thickness direction of the flat filler 12 in the glass matrix 11, the occupation area of the flat fillers 12 having a length in their flat direction of from 0.5 to 20 µm and a length in their thickness direction of from 0.02 to 0.25 µm per unit area of the cross-section is from 30 to 48%.

21 Claims, 1 Drawing Sheet

(51) Int. Cl.
*H01L 23/15* (2006.01)
*H01L 33/48* (2010.01)
*C03C 3/091* (2006.01)
*C03C 3/093* (2006.01)
*H01L 33/44* (2010.01)

(52) U.S. Cl.
CPC ............... *H01L 33/486* (2013.01); *H01L 33/44* (2013.01); *H01L 2224/32225* (2013.01); *H01L 2224/48137* (2013.01); *H01L 2224/48227* (2013.01); *H01L 2224/73265* (2013.01)

(56) References Cited

U.S. PATENT DOCUMENTS 6,366,276 B1 * 4/2002 Kunimatsu et al. ........... 345/175
2010/0080981 A1 * 4/2010 Kobuke et al. ................ 428/329
2012/0300479 A1 11/2012 Okada et al.

FOREIGN PATENT DOCUMENTS

| | | |
|---|---|---|
| JP | 2004-186163 | 7/2004 |
| JP | 2009-302110 | 12/2009 |
| WO | 2011/096126 | 8/2011 |

OTHER PUBLICATIONS

U.S. Appl. No. 14/176,414, filed Feb. 10, 2014, Ohta, et al.
U.S. Appl. No. 14/176,285, filed Feb. 10, 2014, Ohta, et al.
U.S. Appl. No. 14/481,387, filed Sep. 9, 2014, Tanida, et al.

* cited by examiner

GLASS CERAMIC BODY, SUBSTRATE FOR MOUNTING LIGHT EMITTING ELEMENT, AND LIGHT EMITTING DEVICE

TECHNICAL FIELD

The present invention relates to a glass ceramic body, a substrate for mounting a light emitting element, and a light emitting device.

BACKGROUND ART

In recent years, along with a tendency to high brightness and whitening of a light emitting device having a light emitting element such as a light emitting diode, a light emitting device using a light emitting element has been used for a backlight of a mobile phone, a liquid crystal TV, etc. In such a light-emitting device, a substrate is required to have a high thermal conductivity, be able to quickly dissipate heat generated from the light-emitting element and in addition, have a high reflectance and excellent productivity.

Further, the substrate is required to have a designated strength in order to prevent breakage, fracture, etc. due to a stress exerted on the substrate at the time of mounting a light emitting element.

In order to satisfy such requirements, it has been studied to use a glass ceramic substrate as a substrate for a light emitting device. The glass ceramic substrate comprises a glass powder and a ceramic powder such as an alumina powder, and it has a large difference in refractive index between glass and ceramics and many interfaces between them, whereby the glass ceramic substrate has a higher reflectance than conventional ceramic substrates. However, the glass ceramic substrate is required to have a further high reflectance to be used as a substrate for mounting a light emitting element.

Further, for reducing unevenness in various properties such as reflectance and strength, the glass ceramic substrate is also required to have a property to suppress shrinkage at the time of firing, namely firing shrinkage.

In order to increase the reflectance of a glass ceramic substrate, a method of incorporating ceramic particles having a refractive index higher than that of alumina particles, namely high refractive index particles, has been studied. However, one containing high refractive index particles tends to have a low sintering property as compared with one containing fillers of e.g. alumina or silica ($SiO_2$). Accordingly, the content of such fillers cannot be made high, or the composition of glass is significantly restricted. Thus, the degree of freedom of the design is decreased. Accordingly, in order to make it possible to select the glass composition from a wide range, it is desired to increase the reflectance and reduce firing shrinkage by using alumina particles having a good sintering property with glass.

As a method for suppressing firing shrinkage of glass ceramic substrates, a method has been known wherein as ceramic particles, flat particles having an aspect ratio of 5 are aligned to the designated direction (for example, Patent Document 1). Further, as a method for improving the strength, a method has been known wherein ceramic particles having an aspect ratio of at least 4 and at most 10 are dispersed and incorporated (for example, Patent Document 2).

However, by the methods described in Patent Documents 1 and 2, it was not possible in either case to obtain a sufficiently high reflectance as a substrate for mounting a light emitting element.

Patent Document 3 discloses a method for improving the reflectance by a glass ceramic substrate comprising glass and ceramic particles. In Patent Document 3, a light reflection body with a high reflectance is proposed wherein in the cross section viewed from the top of the glass ceramic substrate, the occupation area of the group of particles of ceramic particles having a particle size of from 0.3 to 1.0 μm is made to be from 10 to 70%.

In the light reflection body disclosed in Patent Document 3, fine ceramic particles having a particle size of from 0.3 to 1.0 μm are incorporated in a designated amount in glass to obtain a high reflectance. However, if such fine ceramic particles are incorporated in a large amount in glass, the sintering property of a glass ceramic body tends to be low, the strength of the substrate tends to be low, and voids are likely to be formed at the surface of the substrate.

If such a glass ceramic body is used as a substrate for mounting a light emitting element, breakage due to stress exerted on the substrate at the time of mounting a light emitting element and fracture of an individual piece after cutting tend to result, and thereby the yield may be low.

Further, in the case of the glass ceramic body of Patent Document 3, the crystallinity is at least 50%, and thereby, at the time of firing, the flowability and the sintering property tend to be low due to the crystallization of glass components, and voids are likely to be formed in the substrate and at the surface of the substrate.

If voids are formed in the substrate, although the reflectance becomes slightly high, the strength of the substrate deteriorates, and a plating solution used for metal plating treatment tends to infiltrate into the inside of the substrate from the voids. Thus, after mounting a light emitting element, defects such as connection defects tend to result, and the reliability may deteriorate.

PRIOR ART DOCUMENTS

Patent Documents

Patent Document 1: JP-A-9-71472
Patent Document 2: JP-A-2002-111210
Patent Document 3: JP-A-2007-121613

DISCLOSURE OF INVENTION

Technical Problem

The present invention has been made to solve the above problems, and it is an object of the present invention to provide a glass ceramic body, whereby light which transmits through the substrate and leaks (i.e. emits) out of the incident direction is reduced, the number of voids at the surface of the substrate and in the inside of the substrate is low, and breakage at the time of mounting a light emitting element and fracture, etc. at the time of cutting can be prevented.

Further, it is an object of the present invention to provide a substrate for mounting a light emitting element, which uses such a glass ceramic body, and a light emitting device.

Solution to Problem

The glass ceramic body of the present invention is a glass ceramic body comprising a glass matrix and flat fillers dispersed therein, wherein the flat fillers are dispersed in the glass matrix so that their individual thickness directions would be substantially in the same direction; and in a cross-section along the thickness direction of the flat fillers in the glass matrix, the occupation area of the flat fillers having a length in their flat direction of from 0.5 to 20 μm and a length in their thickness direction of from 0.02 to 0.25 μm per unit area of the cross-section is from 30 to 48%.

The expression "to" showing the above numerical range is used to include the numerical values before and after thereof as the lower limit value and the upper limit value, and hereinafter in this specification, "to" is used to have the same meaning unless otherwise specified.

The substrate for mounting a light emitting element, of the present invention is a substrate for mounting a light emitting element, on which a light emitting element is to be mounted and which comprises the glass ceramic body of the present invention.

The light emitting device of the present invention comprises the substrate for mounting a light emitting element, of the present invention and a light emitting element mounted on the substrate for mounting a light emitting element.

Advantageous Effects of Invention

According to the glass ceramic body of the present invention, in a cross section along the thickness direction, flat fillers having a designated shape are contained in an amount within the designated range, whereby the formation of voids in the surface and in the inside can be suppressed, and the deterioration of the strength can be prevented. Further, even in such a state that the voids are few in the inside, a high reflectance can be obtained.

Further, by using such a glass ceramic body, it is possible to produce a substrate for mounting a light emitting element and a light emitting device, whereby sufficient brightness can be obtained, breakage at the time of mounting a light emitting element and fracture at the time of cutting can be suppressed, and the occurrence of defects such as connection defects due to infiltration of a plating solution into the inside of the substrate can be suppressed.

DESCRIPTION OF EMBODIMENTS

Now, the embodiments of the present invention will be described in detail.

Figure 1:
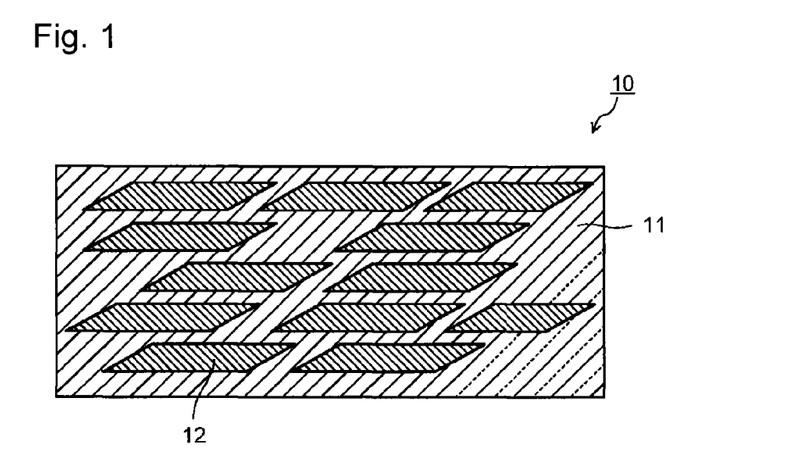
FIG. 1 is a schematic cross-sectional view illustrating a glass ceramic body in an embodiment of the present invention.
Figure 2:
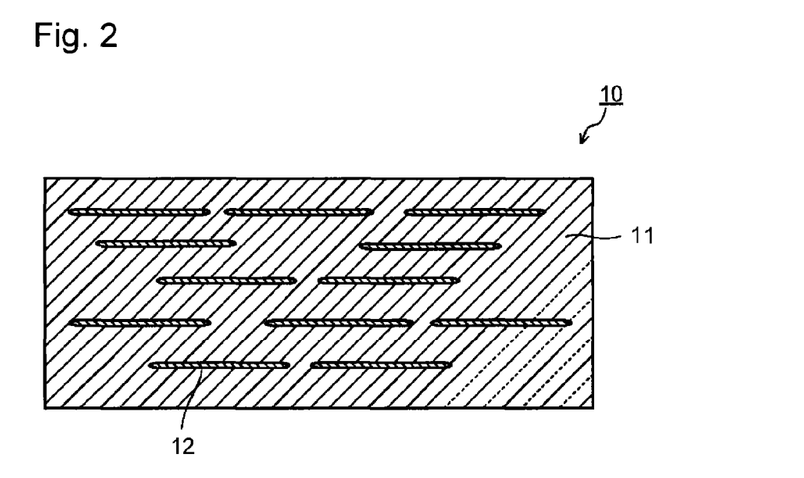
FIG. 2 is a schematic cross-sectional view illustrating a cross section of the glass ceramic body of the present invention along the thickness direction of flat alumina particles.

FIG. 1 is a view illustrating one embodiment of the present invention, and is a schematic cross-sectional view in a plane wherein flat ceramic particles 12 (in this specification, flat ceramic particles are referred to also as flat fillers) are aligned in the form of plates. Further, the flat fillers in the Fig. are schematically represented as parallelogram shaped plates. FIG. 2 is a schematic view at a cross section which is in a relation of normal direction to the cross section of FIG. 1 (corresponding to a cross-sectional view in the thickness direction of the flat fillers). In the Figs., the glass ceramic body 10 comprises a glass matrix 11 and flat fillers 12 dispersed therein so that their individual thickness directions would be substantially in the same direction.

That is, the flat fillers 12 are dispersed so that the flat surfaces of the respective particles would be parallel to one plane. For example, in a case where a glass ceramic body 10 is used as a substrate for mounting a light emitting element 21 (hereinafter, may be referred to simply as a substrate), the flat fillers 12 are dispersed so that their flat surfaces would be parallel to a mounting surface which is the main surface of the substrate for mounting a light emitting element. Further, the thickness direction of the flat fillers 12 is, for example in FIG. 2, the vertical direction, and the flat direction (namely the length direction) is a direction perpendicular to the thickness direction (i.e. the horizontal direction in FIG. 2).

The glass matrix 11 is not particularly restricted, however, the glass matrix 11 is preferably one which is not crystallized after firing, namely amorphous.

The glass matrix 11 is "not crystallized" means that no crystals are present which have precipitated from glass derived from a glass powder as a starting material. It can be confirmed by X-ray diffraction that the glass matrix 11 is not crystallized. In this judgment, when the highest intensity (absolute value) of a peak derived from ceramic particles such as alumina particles in the X-ray diffraction spectrum is 100, one from which no peak derived from glass and having an intensity of at least 10 as the absolute value is observed is judged to be not crystallized one.

According to such a glass ceramic body 10, since crystals will not precipitate in the glass matrix 11 at the time of firing, unevenness in the firing shrinkage can be suppressed. Thus, unevenness in various properties such as unevenness in reflectance, strength, etc. can be suppressed. Further, since crystals will not precipitate, the change in the thermal expansion coefficient can be suppressed, and warpage, etc. can be suppressed. Further, the decrease of glass due to precipitation of crystals can be suppressed, and thereby the amount of ceramic particles containing flat fillers 12 to be introduced can be increased.

When a cross section of the glass ceramic body of the present invention as shown in FIG. 2 is observed by a stereoscopic microscope, the flat fillers 12 are dispersed in the glass matrix 11 so that their individual thickness directions would be substantially in the same direction. The flat fillers 12 have a length in the flat direction (horizontal direction in FIG. 2) of from 0.5 to 20 μm and a length in the thickness direction (vertical direction in FIG. 2) of from 0.02 to 0.25 μm. The "substantially in the same direction" means that when the flat fillers are observed by a stereoscopic microscope, their directions are visually observed to be in the same direction.

Thus, as compared to a substrate in which ceramic particles having a small flat degree are dispersed, the number of times that incident light collides with interfaces between glass and ceramic particles increases. Since the glass has a different refractive index from the ceramic particles, light collided with the interfaces repeats reflection or refraction, and thereby light which transmits through the substrate in the thickness direction and leaks (i.e. emits) in other than the upward direction is reduced. Accordingly, the amount of reflected light which returns to the upward direction of the substrate can be increased.

Further, by using the flat fillers 12 and making their individual thickness directions to be substantially in the same direction, the firing shrinkage in the flat direction can be suppressed, and a high size accuracy can be realized. In the case of such fillers, by adjusting the size in the flat direction of the flat fillers 12, the firing shrinkage in the flat direction can be controlled.

Further, the above-mentioned average length in the flat direction and the average length in the thickness direction are averages of values obtained by cutting the glass ceramic body 10 in a plane along the thickness direction as shown in FIG. 2 and measuring the length in the flat direction and the length in the thickness direction of the individual flat fillers 12 at at least 20 points in an optional 100 μm² cross section by a scanning electron microscope (SEM) and an image analyzer. Further, in a case where a glass ceramic body is prepared by firing a green sheet formed by a doctor blade method, its cutting direction is adjusted to be in a direction substantially parallel to the forming direction in the doctor blade method. In this specification, the "substantially parallel" means parallel at a level of visual observation, unless otherwise specified.

Hereinafter, in a cross section of the glass ceramic body 10 along the thickness direction of the flat fillers 12, the length in the flat direction (in FIG. 2, horizontal direction) of the flat fillers 12 is referred to also as "major diameter", and the length in the thickness direction (in FIG. 2, vertical direction) is referred to also as "minor diameter".

The glass ceramic body 10 comprises flat fillers 12 having a major diameter of from 0.5 to 20 μm and a minor diameter of from 0.02 to 0.25 μm. Further, in a cross section along the thickness direction of the flat fillers as shown in FIG. 2, the flat fillers 12 having the major diameter and the minor diameter within the above ranges, are contained as dispersed so that the occupation area per unit area in the cross section would be from 30 to 48%. The occupation area is more preferably from 35 to 45%. When the proportion of the flat fillers 12 is at least 30%, the number of layers of the flat fillers 12 in the thickness direction increases, and the number of times that incident light collides with interfaces between the glass matrix 11 and the flat fillers 12 increases. Thus, a high reflectance can be obtained, and the firing shrinkage can be suppressed.

On the other hand, when the proportion of the flat fillers 12 is at most 48%, the deterioration of the sintering property due to the decrease of the proportion of the glass matrix 11 can be suppressed. If the proportion of the flat fillers 12 exceeds 48%, the sintering property of glass and the flat fillers 12 deteriorates, voids are likely to be formed at the surface and in the inside of the substrate, and the strength of the substrate deteriorates.

Further, in the same manner as the above-mentioned major diameter and minor diameter are obtained, the area of the above-mentioned flat fillers 12 can be obtained by cutting the glass ceramic body 10, measuring areas of the individual flat fillers 12 satisfying the above-mentioned ranges of the major diameter and the minor diameter in an optional 100 μm² cross section by a scanning electron microscope (SEM) and an image analyzer and calculating the total. So far as the flat fillers satisfy the above ranges, even in a case where flat fillers having different chemical compositions are used, for example, alumina and mica, all of them are included in the total.

As the sizes of the flat fillers 12 so as to obtain the above major diameter and minor diameter, as the sizes of the flat fillers 12 themselves as a starting material powder, those having an average major diameter of from 0.5 to 20 μm as an average value of the maximum length of the major diameter and an average minor diameter of from 0.02 to 0.25 μm as an average value of the minor diameter are preferred. Further, those having an average aspect ratio (average major diameter/average minor diameter) of from 25 to 80 as a ratio of the average major diameter to the average minor diameter are preferred. As described later, the average aspect ratio is referred to also as a cross-sectional particle aspect ratio.

Further, as a starting material powder, flat fillers 12 having different average aspect ratios may be mixed and used. In such a case, the total value of values obtained by multiplying an average aspect ratio of individual flat fillers 12 by their abundance proportion is taken as an apparent aspect ratio.

As the starting material powder for obtaining the above area, the blend proportion of the flat fillers is preferably from 35 to 60 mass % per the total amount of the glass powder and the flat fillers. The blend proportion of the flat fillers is more preferably from 45 to 58 mass %, further preferably from 45 to 55 mass %. When the proportion of the flat fillers is at least 35 mass %, the number of times that incident light collides with interfaces between the glass matrix and the flat fillers 12 increases, a high reflectance can thereby be obtained, and the firing shrinkage can be suppressed. On the other hand, when the proportion of the flat fillers is at most 60 mass %, the deterioration of the sintering property due to a decrease of the proportion of the glass matrix 11 can be suppressed.

Further, in the cross section of the glass ceramic body 10 as shown in FIG. 2, in the occupation area of the group of flat fillers having a major diameter of from 0.5 to 20 μm and a minor diameter of from 0.02 to 0.25 μm, the occupation area of flat fillers having an aspect ratio (hereinafter referred to as cross-sectional particles aspect ratio) of at least 25 is preferably at least 30%, particularly preferably at least 35%.

Further, the cross-sectional particles aspect ratio of the flat fillers 12 is a ratio of the major diameter to the minor diameter and a value represented by (major diameter/minor diameter). The cross-sectional particles aspect ratio of the flat fillers 12 is preferably from 25 to 80.

As the flat fillers 12, for example, at least one ceramics selected from the group consisting of alumina, mica, silica and boron nitride is preferably used. Among them, alumina or mica is preferably used. As an example of preferred alumina, alumina obtained by hydrothermal synthesis (for example, tradename: SERATH manufactured by KINSEIMATEC CO., LTD.) may be mentioned.

Further, a part of the above typical flat fillers 12 may be replaced by particulate (hereinafter referred to as indeterminate form) fillers (ceramic particles) which are not flat and have an aspect ratio of at most 3 such as $Al_2O_3$, $SiO_2$, $ZrO_2$, $TiO_2$, MgO, mullite, AlN, $Si_3N_4$, SiC, forsterite or cordierite. The amount of the indeterminate form fillers to be replaced is up to 23 mass % per the total amount of the glass ceramic body.

When a cross section of the glass ceramic body 10 as shown in FIG. 2 is observed, the flat fillers 12 preferably have an average length of the major diameter of from 0.5 to 20 μm and an average length of the minor diameter of from 0.02 to 0.25 μm. Further, in this specification, the average aspect ratio (the average length of the major diameter/the average length of the minor diameter) which is a ratio of the average length of the major diameter to the average length of the minor diameter is referred to as average cross-sectional particles aspect ratio, and the average cross-sectional particle aspect ratio is preferably from 25 to 80.

A glass component of the glass matrix 11 is not particularly restricted so long as crystals are not formed at the time of firing within the firing temperature range, however, ceramics such as flat fillers, particularly ones having a difference in refractive index of at least 0.15 from alumina is preferred. That is, when the refractive index of glass is represented by "a", and the refractive index of alumina is represented by "b", the absolute value of (b-a) is preferably at least 0.15, more preferably at least 0.17, particularly preferably at least 0.19. When the difference in refractive index between glass and alumina is at least 0.15, scattering at interfaces is excellent, and the reflectance becomes high.

As such glass, $SiO_2$—$B_2O_3$ glass is preferred, $SiO_2$—$B_2O_3$-MO (M: alkaline earth metal) glass is more preferred, and $SiO_2$—$B_2O_3$—$Al_2O_3$-MO (M: alkaline earth metal) glass is particularly preferred.

The refractive index of such glass can be calculated by using Appen coefficient. Additive factors (coefficients) of respective components in silicate glass containing alkalis are shown in Table 1 (Source: A.A. Appen: chemicals of glass, NISSO TSUSHINSHA (1974) pp. 318).

TABLE 1

|  | Additive factors |
|---|---|
| $SiO_2$ | 1.46~1.48 |
| $B_2O_3$ | 1.46~1.71 |
| $Al_2O_3$ | 1.52 |
| MgO | 1.61 |
| CaO | 1.73 |
| SrO | 1.78 |
| $Na_2O$ | 1.59 |
| $K_2O$ | 1.58 |
| $TiO_2$ | 2.13 |
| $ZrO_2$ | 2.2 |
| LiO | 1.7 |
| ZnO | 1.71 |

In each type of the above glass, $SiO_2$ and $B_2O_3$ to be glass network formers and $Al_2O_3$ to improve the stability, the chemical durability and the strength of glass, are preferably contained in at least certain proportions, also with a view to preparing glass having a low refractive index. The total content of $SiO_2$, $B_2O_3$ and $Al_2O_3$ is at least 57 mol %, preferably at least 62 mol %, further preferably at least 67 mol %.

From the viewpoint of raising a reflectance of the glass ceramic body 10 and suppressing the deterioration of the strength, the content of $B_2O_3$ in glass is preferably at least 10 mol %.

In general, $ZrO_2$ fillers have a high refractive index but are poor in the sintering property with glass. Thus, if $ZrO_2$ fillers are added in the glass matrix 11, due to insufficient sintering of glass with $ZrO_2$ fillers, the strength of the substrate deteriorates, or voids are formed in the inside of the substrate in some cases.

When the content of $B_2O_3$ is at least 10 mol %, the sintering property of glass with $ZrO_2$ fillers is improved, and even in a case where $ZrO_2$ fillers are used as ceramic particles, the formation of voids and the deterioration of the strength hardly result.

An alkaline earth metal oxide is added so as to improve the stability of glass, to lower the glass melting temperature or the glass transition point (Tg) and to improve the sintering property. When flat fillers are used, as the alkaline earth metal oxide, CaO is particularly preferred, since the sintering property of the glass ceramic body 10 is improved. From the viewpoint of the stability of glass, the glass melting temperature, the glass transition point (Tg), the sintering property, etc., the content of the alkaline earth metal oxide is preferably from 15 to 40 mol %. When the content of the alkaline earth metal oxide is at least 15 mol %, excessive rising of the glass melting temperature can be suppressed. On the other hand, when the content of the alkaline earth metal oxide is at most 40 mol %, the refractive index of the glass can be suppressed from being excessively high, and the difference in refractive index between ceramic particles and the glass can be made large, and thereby the reflectance can be made high. The content of the alkaline earth metal oxide is more preferably from 18 to 38 mol %, further preferably from 20 to 35 mol %.

An alkali metal oxide such as $K_2O$ or $Na_2O$ to lower the glass transition point (Tg) may be added in an amount of from 0 to 10 mol %. Such an alkali metal oxide is preferably contained with a view to preparing a low refractive index glass, since its degree of increasing the refractive index is remarkably low as compared with the alkaline earth metal oxide. However, if the total content of $K_2O$ and $Na_2O$ exceeds 10 mol %, the chemical durability particularly the acid resistance may be decreased, and the electrical insulating properties may be decreased. The total content of $K_2O$ and $Na_2O$ is preferably from 1 to 8 mol %, more preferably from 1 to 6 mol %.

ZnO, $TiO_2$ and SnO may be added for the purpose of lowing the softening point like the alkaline earth metal oxide. However, the addition amount of such components is preferably suppressed to be at most 20 mol %, since their degree of increasing the refractive index is high as compared with other additive components.

As a typical example of glass of the glass matrix, $SiO_2$—$B_2O_3$ glass containing from 15 to 40 mol % of CaO as represented by oxide is mentioned. In this glass, $SiO_2$ is preferably from 38 to 60 mol %, and $B_2O_3$ is preferably from 13 to 25 mol %.

Further, the glass is not limited to one consisting of the above components, and may contain other components within a range to satisfy the properties such as the difference in refractive index. If the glass contains other components, their total content is preferably at most 10 mol %, preferably at most 5 mol %.

As the flat fillers 12, for example, preferred are flat alumina particles produced by a method of producing flat boehmite particles by subjecting aluminum hydroxide to hydrothermal synthesis and subjecting the boehmite particles to heat treatment. According to such a method, by subjecting the boehmite particles to heat treatment, particularly controlling the temperature of the heat treatment, the crystalline structure can be adjusted. Now, the production method will be explained in detail.

First, starting materials containing aluminum hydroxide and water are put in an autoclave and heated under pressure to carry out hydrothermal synthesis without stirring or with stirring at a low rate. A reaction product obtained by the hydrothermal synthesis is washed, filtrated and dried to obtain boehmite particles.

As a case requires, a pH adjustor may be added to reaction starting materials to adjust the pH to at least 8, preferably at least 11. The pH adjustor may, for example, be a hydroxide of an alkali metal such as sodium or potassium, a hydroxide of an alkaline earth metal such as barium, calcium or strontium or their aluminates.

By adding the pH adjustor to the reaction starting materials, the reaction system is made to be alkaline, whereby the solubility of aluminum hydroxide which is a starting material is increased, the reaction time may be reduced, and the size of boehmite particles can be made to be large, as compared with a case where the pH adjustor is not added.

The amount of water added as a reaction starting material is preferably from 2 to 25 times in the mass ratio per aluminum hydroxide. If the mass ratio is less than 2 times, the reaction material cannot be sufficiently reacted. On the other hand, if the mass ratio exceeds 25 times, an amount of useless water increases, and thereby product cost becomes high, and the productivity may be low.

Further, a monomer or a polymer of a (meth)acrylic acid ester is preferably added to the reaction starting material. In such a case, flat boehmite particles, namely flat alumina particles are easily obtained.

The monomer of the (meth)acrylic acid ester means an acrylic acid ester or a methacrylic acid ester, and these are generally referred to as (meth)acrylic acid ester. As specific examples of the (meth)acrylic acid ester, methyl acrylate, ethyl acrylate, propyl acrylate, butyl acrylate, heptyl acrylate, hexyl acrylate, octyl acrylate, nonyl acrylate, 2-ethylhetyl acrylate, dodecyl acrylate, butyl methacrylate, hexyl methacrylate, octyl methacrylate, decyl methacrylate, dodecyl methacrylate or hexadecyl methacrylate may be mentioned.

The polymer of the (meth)acrylic acid ester includes a polymer comprising only one type of the above-mentioned (meth)acrylic acid ester, a copolymer comprising such (meth) acrylic acid esters, and a polymer or a copolymer comprising the (meth)acrylic acid ester and another monomer such as ethylene or styrene.

The temperature in the autoclave at the time of the hydrothermal synthesis is preferably from 110 to 300° C. If the temperature is less than 110° C., it is difficult to produce boehmite particle as a reaction product. If the temperature exceeds 300° C., a large amount of energy to maintain such a temperature is consumed, and thereby it is disadvantageous from the viewpoint of cost.

Although the heating time varies depending on a situation of stirring or still standing, the reaction time is preferably from 4 to 24 hours. If the reaction time is less than 4 hours, aluminum hydroxide may be unreacted. On the other hand, if the reaction time exceeds 24 hours, the productivity deteriorates, and it is disadvantageous from the viewpoint of cost.

The alumina particles can be produced by firing the boehmite particles obtained by the above method at a temperature of, for example, from 450 to 1,500° C. by an electronic furnace or the like. Here, when the temperature is from 450 to 900° C., γ-alumina crystalline structure is mainly formed, when the temperature is from 900 to 1,100° C., δ-alumina crystalline structure is mainly formed, when the temperature is from 1,100 to 1,200° C., θ-alumina crystalline structure is mainly formed, and when the temperature is from 1,200 to 1,500° C., α-alumina crystalline structure is mainly formed.

Alumina particles produced by firing boehmite particles maintain a shape of the boehmite particles before firing, irrespective of types of alumina. Thus, by using flat boehmite particles, flat alumina particles can be obtained.

The firing time is preferably from 1 to 4 hours, further preferably from 1.5 to 3.5 hours. If the firing time is less than 1 hour, firing is insufficient, and it is difficult to produce alumina particles. Further, since formation of alumina particles is almost finished within 4 hours, firing longer than 4 hours is not economical.

As the method for producing alumina particles, the above method is mentioned as a preferred method. However, so long as the designated crystalline structure and shape are formed, the method is not necessarily restricted to the above method, and a known production method may be appropriately adopted.

In the foregoing, the glass ceramic body 10 of the present invention is explained. As mentioned above, all of ceramic particles may not necessarily be flat fillers, and as the case requires, indeterminate form fillers may be contained, so long as the object of the present invention is not impaired.

The glass ceramic body 10 has an average flexural strength of preferably at least 180 MPa, more preferably at least 200 MPa.

When the glass ceramic body 10 is formed into a flat plate having a thickness of 300 μm, the flat plate has a reflectance of preferably at least 83%, more preferably at least 90%, at a wavelength of 460 nm. For example, $ZrO_2$ fillers are preferably contained in the glass ceramic body 10, so that a higher reflectance can be obtained.

Now, a substrate for mounting a light emitting element, which is provided with the glass ceramic body 10 and a light emitting device will be explained.

Figure 3:
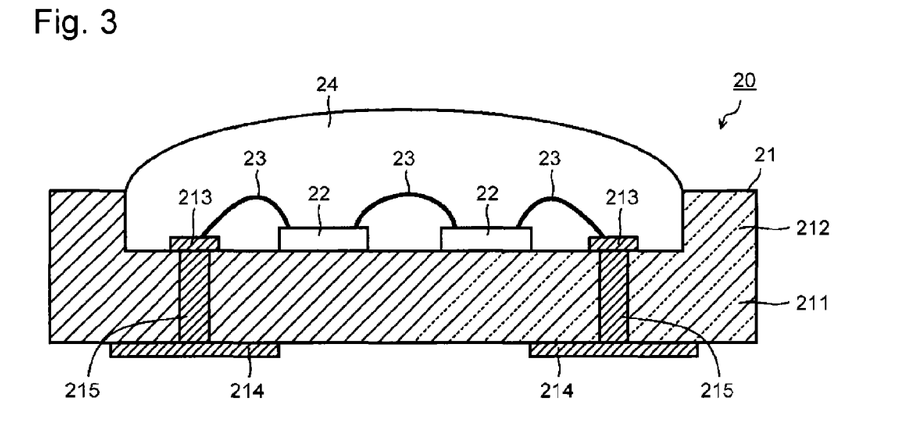
FIG. 3 is a cross-sectional view illustrating a light emitting device in an embodiment of the present invention.

FIG. 3 is a cross sectional view illustrating a light emitting device 20 provided with the glass ceramic body 10 of the present invention.

The light emitting device 20 has a substrate 21 for mounting a light emitting element wherein at least a part of the substrate is made of the glass ceramic body 10. For example, the substrate 21 is provided with two light emitting elements 22, electrically connected by bonding wires 23 in series and provided with a sealing layer 24 so as to cover these light emitting elements 22 and the bonding wires 23 to produce a light emitting device 20.

The substrate 21 is constituted, for example, by a substantially flat substrate base 211 and a frame 212 which is set on a surface of the substrate base 211 to be a mounting surface for a light emitting element 22. The mounting surface of the base substrate 211 is provided with a pair of element connection terminals 213, and the back surface of the substrate base 211 is provided with a pair of external connection terminals 214 which are electrically connected to an external circuit. The inside of the substrate base 211 is provided with a pair of through hole conductors 215 to electrically connect these element connection terminals 213 and external connection terminals 214. Further, in this specification, the "substantially flat" means flat at a level of visual observation.

Regarding such a substrate 21, a part excluding e.g. conductor portions such as the element connection terminals 213, the external connection terminals 214 and the through hole conductors 215, is the glass ceramic body 10 of the present invention. Further, the part of the glass ceramic body 10 may be at least a part other than the conductor portions, for example, be a part other than the conductor portions in the substrate base 211.

Further, in such a substrate 21, flat fillers 12 are usually dispersed so that the thickness direction of the flat fillers 12 would be in the same direction as the thickness direction of the substrate 21, namely, so that the flat plane of the flat fillers would be substantially parallel to the mounting surface and the back surface of the substrate 21.

Now, the method for producing the substrate for mounting a light emitting element 20 will be explained.

First, to a glass ceramic composition containing at least a glass powder and flat fillers, a binder and as the case requires, a plasticizer, a solvent, a leveling agent, a dispersing agent, etc. are added to prepare a slurry. This slurry is formed into a sheet form e.g. by a doctor blade method, followed by drying, to produce a green sheet.

The glass powder can be obtained by producing glass containing the above-described glass components by a melting method and grinding the glass by a dry grinding method or a wet grinding method. In the case of a wet grinding method, it is preferred to use water as a solvent. The grinding can be carried out by using a grinding machine such as a roll mill, a ball mill or a jet mill.

The particle size of the glass powder is preferably from 0.5 μm to 3 μm by 50% particle size ($D_{50}$). If the 50% particle size of the glass powder is less than 0.5 μm, the glass powder is likely to cohere, whereby the handling tends to be difficult, and it tends to be difficult to uniformly disperse it. On the other hand, if the 50% particle size of the glass powder exceeds 3 μm, the glass softening temperature is likely to rise, or the sintering is likely to be inadequate. The particle size can be adjusted, for example, by classification after the grinding as the case requires. In this specification, the particle size of a powder is a value measured by a particle size analyzer (manufactured by Nikkiso Co., Ltd., tradename: MT3100II) of a laser diffraction scattering method.

On the other hand, regarding the flat fillers, in a cross section as shown in FIG. 2, the major diameter of the flat fillers 12 is from 0.5 to 20 μm, and the minor diameter is from 0.02 to 0.25 μm.

To such a glass ceramic composition comprising the glass powder and the flat fillers, a binder is blended, and the case requires, a solvent (organic solvent), a plasticizer, etc. are added to obtain a slurry.

The blend proportion of the flat fillers is preferably from 35 to 60 mass %, more preferably from 40 to 58 mass %, per the total amount of the glass powder and the flat fillers.

The binder may, for example, be preferably polyvinyl butyral or an acrylic resin. The plasticizer may, for example, be dibutyl phthalate, dioctyl phthalate or butyl benzyl phthalate. Further, the solvent may be an aromatic or alcohol organic solvent such as toluene, xylene or butanol. It is preferred to use a mixture of an aromatic solvent with an alcohol solvent. Further, it is also possible to use a dispersing agent or a leveling agent in combination.

The slurry has a composition comprising, for example, 54.1 mass % of solid content (glass powder+alumina flat fillers), 36.5 mass % of an organic solvent (a solvent mixture of toluene, xylene, isopropyl alcohol (2-propanol) and 2-butanol), 0.8 mass % of a dispersing agent, 3.2 mass % of a plasticizer, and 5.4 mass % of a resin as a binder.

For preparation of the slurry, at least the glass powder and the alumina powder are added to a solvent mixture having a leveling agent and a dispersion agent mixed as the case requires with an organic solvent, and the mixture is stirred by a ball mill using $ZrO_2$ as a medium. A vehicle having a resin as a binder dissolved in an organic solvent is added thereto, followed by stirring by a propeller stirring rod, and then by filtration through a mesh filter. Bubbles included inside can be removed by stirring in vacuum.

Then, the obtained slurry is applied on a PET film coated with a release agent, for example, by a doctor blade to form a sheet, followed by drying to produce a green sheet. By such formation of the green sheet, it is possible to align the flat fillers so that their individual minor diameters would be substantially in the same direction.

That is, at the time of the application by the doctor blade method, the slurry containing the glass powder, the flat fillers, etc. will pass through a space formed by the tip of the blade portion of the doctor blade apparatus and the surface of the film, whereby the flow (streamline) of the slurry will be aligned along the film transportation direction. On that occasion, the flat fillers dispersed in the slurry will also pass through the space so as to be aligned along the flow of the slurry. Accordingly, the flat fillers in the green sheet will be aligned so that the direction of their flat plane is in parallel to the plane direction of the sheet.

On the green sheet, non-fired conductors such as a non-fired element connection terminal 213, a non-fired external connection terminal 214 and a non-fired through hole conductor 215 are formed. The method for forming the non-fired conductors is not particularly restricted, and a conductor paste is applied by a screen printing method. As the conductor paste, one prepared by adding a vehicle such as ethylcellulose and as the case requires a solvent, etc. to a metal powder containing as the main component, for example, one of copper, silver, gold, aluminum, etc. may be used. Among them, the silver powder or the copper powder is preferred.

Then, a plurality of the above green sheets are overlaid with positioning, and then bonded by thermal compression. Then, binder burn out to decompose and remove the binder, etc. is carried out and then, firing is carried out to sinter the glass ceramic composition thereby to obtain a substrate 21.

Binder burn out is carried out preferably by holding the substrate, for example, at a temperature of at from 500° C. to 600° C. for from 1 to 10 hours. If the binder burn out temperature is lower than 500° C. or the binder burn out time is less than one hour, the binder, etc. may not sufficiently be decomposed and removed. When the binder burn out temperature is about 600° C. and the binder burn out time is about 10 hours, the binder, etc. can sufficiently be removed. However, if the binder burn out time exceeds 10 hours, the productivity, etc. may rather be deteriorated.

Firing is carried out by holding the substrate, for example, at a temperature of from 850° C. to 900° C. for from 20 minutes to 60 minutes, particularly preferably at a temperature of from 860° C. to 880° C. If the firing temperature is less than 850° C. or if the firing time is less than 20 minutes, a dense sintered product may not be obtained. When the firing temperature is about 900° C. and the firing time is about 60 minutes, a sufficiently dense product will be obtained, and if the firing temperature or the firing time exceeds the above range, the productivity, etc. may rather be deteriorated. Further, in a case where a conductor paste containing a metal powder containing silver as the main component is used, if the firing temperature exceeds 900° C., the conductor paste is softened too much, whereby the designated shape cannot be maintained.

When the flat fillers are fired in a state where they are aligned in parallel with the plane direction of the green sheet, only the glass powder is melted while the alignment of the flat fillers are as they are. On that occasion, gaps among the flat fillers are filled with the molten glass, and as the movement in the plane direction of the flat fillers aligned in parallel with the plane direction is restricted, the gaps among the flat fillers in the plane direction are maintained, and only the gap dimension in the thickness direction is reduced. Accordingly, shrinkage occurs only in the thickness direction at the time of firing the green sheet, and shrinkage in the plane direction is suppressed. Thus, the firing shrinkage in the plane direction is reduced without applying an external pressure, whereby a glass ceramic substrate with high dimensional accuracy can be obtained.

According to such a production method, by using flat fillers having a high flatness and firing the flat fillers so that their individual thickness directions would be substantially in the same direction, light which transmits through a substrate in the thickness direction and leaks (i.e. emits) other than the upward direction is reduced, whereby a reflectance is made to be high, and the firing shrinkage in the flat direction can be suppressed.

Further, by blending such flat fillers so as to be the designated content in a glass matrix, the deterioration of the sintering property can be suppressed, and the deterioration of the strength and the formation of voids in the substrate can be suppressed.

EXAMPLES

Now, the present invention will be described in detail with reference to specific Examples.

Working Examples: Examples 1 to 19; Comparative Examples: Examples 20 to 21

In order to attain a glass composition as shown in Table 2, respective glass materials were blended and mixed to obtain a material mixture. This material mixture was put in a platinum crucible and melted at from 1,200 to 1,500° C. for 60 minutes, and a melt was cast and cooled. Then, the cooled product was ground by an alumina ball mill using water as a solvent for from 10 to 60 hours and classified to obtain glass powder G1 to G13 having a composition as shown in Table 2.

Separately, a flat boehmite powder was produced by subjecting aluminum hydroxide to hydrothermal synthesis, and the boehmite powder was fired to obtain flat alumina fillers. That is, first, aluminum hydroxide, sodium hydroxide or calcium carbonate as a pH adjustor and water were charged in an autoclave. Here, the pH was adjusted to at least 8, and the content of water was at least 5 times of the amount of aluminum hydroxide by mass ratio. Then, they were reacted at from 150 to 200° C. for from 2 to 10 hours under normal pressure. Then, washing with water, filtration and cleaning were carried out to obtain flat boehmite particles.

Then, the boehmite powder was fired at from 800 to 1,300° C. to obtain flat alumina fillers having an average major diameter of from 2 to 3.5 μm as an average value of the maximum length of the major diameter, an average minor diameter of from 0.08 to 0.2 μm as an average value of the minor diameter and an average cross-sectional particle aspect ratio (average major diameter/average minor diameter) of from 25 to 50.

Further, the average aspect ratio, etc. were adjusted by adjusting the average aspect ratio, etc. at the time of producing the flat boehmite powder.

Then, as shown in Tables 3 to 5, a glass powder and as the ceramic powder, flat alumina fillers, flat mica fillers, indeterminate form alumina fillers or indeterminate form zirconia fillers were blended in designated proportions and mixed. In Tables 3 to 5, as the mixing proportions of the glass powder and the ceramic powder, the proportion of the ceramic powder is represented by mass %. Accordingly, the proportion of the glass powder in each Example is a value obtainable by subtracting the mass % of the ceramic powder from 100 mass %.

As the indeterminate form alumina fillers, an alumina powder (manufactured SHOWA DENKO K.K., tradename: AL-45H) having a 50% particle size ($D_{50}$) of 2 μm and a specific surface area of 4.5 m$^2$/g was used, and as the indeterminate form zirconia fillers, a zirconia ($ZrO_2$) powder (manufactured by Daiichi Kigenso Kagaku Kogyo Co., Ltd., tradename: HST-3F) having a 50% particle size ($D_{50}$) of 0.5 μm and a specific surface area of 8.0 m$^2$/g was used.

As the flat mica fillers, a mica powder (manufactured by Topy Industries Ltd., tradename: PDM-5B) having a 50% particle size ($D_{50}$) of 6.0 μm was used.

50 g of this mixed powder (glass ceramic composition) was blended with 15 g of an organic solvent (toluene, xylene, 2-propanol and 2-butanol were mixed in a mass ratio 4:2:2:1), 2.5 g of a plasticizer (di-2-ethylhexyl phthalate), 5 g of a polyvinyl butyral (manufactured by Denki Kagaku Kogyo Kabushiki Kaisha, tradename: PVK#3000K) as a binder, and 0.5 g of a dispersant (manufactured by BYK Japan K.K., tradename: BYK180) and mixed to prepare a slurry. The slurry was applied on a PET film by a doctor blade method, dried and cut into 40 mm$^2$ green sheets (lengthwise 44 mm×crosswise 40 mm) having a thickness of 0.2 mm.

Then, 6 sheets of these green sheets were overlaid and bonded by applying a pressure of 10 MPa at 80° C. Then, the green sheet was held in a firing furnace at 550° C. for 5 hours to decompose and remove the binder resin, and then held at 870° C. for 30 minutes to carry out firing In such a manner, a glass ceramic body having a thickness of 500 μm was obtained. The strength, the water absorption, etc. of the glass ceramic body were measured as described below. Further, the crystallinity of glass of the glass ceramic body was measured by X-ray diffraction. As a result, crystallization was not measured in all samples.

(Average Flexural Strength)

The above-mentioned glass ceramic body was subjected to a three point flexural strength test in accordance with JIS C2141. That is, one side of the glass ceramic body was supported by 2 points, a load was gradually applied at the middle point between said 2 points on the opposite side, and a load when the glass ceramic body was cut was measured. Based on the load, a three points flexural strength (MPa) was calculated. By measuring 30 times of the flexural strength, an average value (average flexural strength) was obtained. Results are shown in Tables 3 to 5.

(Water Absorption)

The water absorption of the glass ceramic body was measured in accordance with JIS R2205. That is, a dry weight of the glass ceramic body and a weight of a saturated substrate by a vacuum method were measured, and based on these values, the water absorption was calculated. Results are shown in Tables 3 to 5. Further, the lower the value of the water absorption is, the less the number of open pores is.

Separately, a glass ceramic body (hereinafter referred to as a substrate for measuring a reflectance) for measuring a reflectance was produced. That is, the same green sheets as used for producing the above-mentioned glass ceramic body were overlaid and bonded so as to have a film thickness of 300 μm after firing. Then, under the same condition as for the above-mentioned ceramic body, the binder resin was decomposed and removed, and the glass ceramic body was fired to obtain a substrate for measuring a reflectance.

(Reflectance)

The reflectance of a surface of the substrate for measuring a reflectance was measured. The reflectance was measured by a spectroscope USB2000 and a small integrating sphere ISP-RF manufactured by Ocean Optics and calculated as a reflectance (unit: %) at 460 nm. Results are shown in Tables 3 to 5.

(Shape of Particles)

The above-mentioned glass ceramic body was cut in the thickness direction and the substantially parallel direction to the forming direction by the doctor blade, and the cut surface was mirror polished. The major diameter and the minor diameter of individual particles in a 100 μm$^2$ cross section were measured by means of a scanning electron microscope (SEM) and an image analyzer, and by averaging them, the average length of the major diameter and the average length of the minor diameter of the particles were obtained. Further, an area of the particles on the cross section was measured to obtain a proportion of area of the particles per unit area. Results are shown in Tables 3 to 5.

Further, the area ratio of the flat alumina fillers and the flat mica fillers was calculated by measuring the area of the particles having the major diameter (the length in the flat direction) of 0.5 to 20 μm and the minor diameter (the length in the thickness direction) of from 0.02 to 0.25 μm in the above-mentioned 100 μm$^2$ cross section.

TABLE 2

| (mol %) | | G1 | G2 | G3 | G4 | G5 | G6 | G7 | G8 | G9 | G10 | G11 | G12 | G13 |
|---|---|---|---|---|---|---|---|---|---|---|---|---|---|---|
| Glass composition | $SiO_2$ | 47.9 | 41.7 | 66.6 | 62.8 | 62.8 | 46.6 | 40.5 | 48.0 | 47.9 | 46.6 | 50.0 | 51.2 | 51.9 |
| | $B_2O_3$ | 15.6 | 15.6 | 16.3 | 16.2 | 16.2 | 15.1 | 15.1 | 18.7 | 15.6 | 15.1 | 18.0 | 15.2 | 15.3 |
| | ZnO | 0.0 | 0.0 | 0.0 | 0.0 | 0.0 | 0.0 | 0.0 | 0.0 | 0.0 | 0.0 | 5.0 | 7.3 | 4.9 |
| | $Al_2O_3$ | 6.0 | 6.0 | 6.2 | 6.2 | 6.2 | 2.8 | 2.8 | 2.9 | 6.0 | 2.8 | 7.0 | 6.8 | 6.9 |
| | MgO | 0.0 | 0.0 | 0.0 | 0.0 | 0.0 | 0.0 | 0.0 | 0.0 | 0.0 | 0.0 | 0.0 | 0.0 | 0.0 |
| | CaO | 27.5 | 33.7 | 3.9 | 3.9 | 7.8 | 32.6 | 38.7 | 27.4 | 27.5 | 32.6 | 20.0 | 19.5 | 19.8 |

TABLE 2-continued

| (mol %) | | G1 | G2 | G3 | G4 | G5 | G6 | G7 | G8 | G9 | G10 | G11 | G12 | G13 |
|---|---|---|---|---|---|---|---|---|---|---|---|---|---|---|
| | SrO | 0.0 | 0.0 | 0.0 | 0.0 | 0.0 | 0.0 | 0.0 | 0.0 | 0.0 | 0.0 | 0.0 | 0.0 | 0.0 |
| | BaO | 0.0 | 0.0 | 0.0 | 3.9 | 0.0 | 0.0 | 0.0 | 0.0 | 0.0 | 0.0 | 0.0 | 0.0 | 0.0 |
| | $Li_2O$ | 0.0 | 0.0 | 0.0 | 0.0 | 2.3 | 0.0 | 0.0 | 0.0 | 0.0 | 0.0 | 0.0 | 0.0 | 0.0 |
| | $Na_2O$ | 2.0 | 2.0 | 4.7 | 4.7 | 2.4 | 1.9 | 1.9 | 2.0 | 2.0 | 2.9 | 0.0 | 0.0 | 1.2 |
| | $K_2O$ | 1.0 | 1.0 | 2.3 | 2.3 | 2.3 | 1.0 | 1.0 | 1.0 | 1.0 | 0.0 | 0.0 | 0.0 | 0.0 |

TABLE 3

| | | Ex. 1 | Ex. 2 | Ex. 3 | Ex. 4 | Ex. 5 | Ex. 6 | Ex. 7 |
|---|---|---|---|---|---|---|---|---|
| Ceramic powder (mass %) | Alumina (flat) | 46 | 51 | 56 | 46 | 51 | 56 | 46 |
| | Mica (flat) | — | — | — | — | — | — | — |
| | Zirconia (indeterminate forms) | — | — | — | — | — | — | — |
| | Alumina (indeterminate forms) | — | — | — | — | — | — | — |
| Glass | | G1 | G1 | G1 | G1 | G1 | G1 | G1 |
| Average flexural strength (MPa) | | 290 | 325 | 320 | 285 | 300 | 305 | 270 |
| Water absorption (%) | | 0 | 0 | 0 | 0 | 0 | 0 | 0 |
| Size of flat fillers (cross section in thickness direction) | Average length of the major diameter (μm) | 2.5 | 2.5 | 2.5 | 2.5 | 2.5 | 2.5 | 2.5 |
| | Average length of the minor diameter (μm) | 0.1 | 0.1 | 0.1 | 0.05 | 0.05 | 0.05 | 0.08 |
| | Aspect ratio | 25 | 25 | 25 | 50 | 50 | 50 | 31 |
| Area ratio (%) | Alumina (flat) | 35 | 39.7 | 44.6 | 35 | 39.7 | 44.6 | 36.5 |
| | Mica (flat) | — | — | — | — | — | — | — |
| | Zirconia (indeterminate forms) | — | — | — | — | — | — | — |
| | Alumina (indeterminate forms) | — | — | — | — | — | — | — |
| Reflectance (%) | | 88 | 92 | 92 | 89 | 90 | 93 | 85 |
| Crystallinity of glass | | —*1 | —*1 | —*1 | —*1 | —*1 | —*1 | —*1 |

*1 crystallization peak other than peaks derived from the fillers was not measured.

TABLE 4

| | | Ex. 8 | Ex. 9 | Ex. 10 | Ex. 11 | Ex. 12 | Ex. 13 | Ex. 14 |
|---|---|---|---|---|---|---|---|---|
| Ceramic powder (mass %) | Alumina (flat) | 51 | 51 | 51 | 51 | 43 | 43 | 43 |
| | Mica (flat) | — | — | — | — | — | — | — |
| | Zirconia (indeterminate forms) | — | — | — | — | 9 | 9 | 9 |
| | Alumina (indeterminate forms) | — | — | — | — | — | — | — |
| Glass | | G1 | G1 | G1 | G2 | G6 | G7 | G8 |
| Average flexural strength (MPa) | | 275 | 230 | 255 | 256 | 220 | 260 | 255 |
| Water absorption (%) | | 0 | 0 | 0 | 0 | 0 | 0 | 0 |
| Size of flat fillers (cross section in thickness direction) | Average length of the major diameter (μm) | 2.5 | 3.5 | 2 | 2.5 | 2.5 | 2.5 | 2.5 |
| | Average length of the minor diameter (μm) | 0.08 | 0.1 | 0.08 | 0.08 | 0.08 | 0.08 | 0.08 |
| | Aspect ratio | 31 | 35 | 25 | 31 | 31 | 31 | 31 |
| Area ratio (%) | Alumina (flat) | 41.3 | 44 | 43.2 | 41.3 | 35.9 | 35.9 | 35.9 |
| | Mica (flat) | — | — | — | — | — | — | — |
| | Zirconia (indeterminate forms) | — | — | — | — | 4.8 | 4.8 | 4.8 |
| | Alumina (indeterminate forms) | — | — | — | — | — | — | — |
| Reflectance (%) | | 88 | 88 | 88 | 87 | 88 | 90 | 92 |
| Crystallinity of glass | | —*1 | —*1 | —*1 | —*1 | —*1 | —*1 | —*1 |

*1 crystallization peak other than peaks derived from the fillers was not measured.

TABLE 5

| | | Ex. 15 | Ex. 16 | Ex. 17 | Ex. 18 | Ex. 19 | Ex. 20 | Ex. 21 |
|---|---|---|---|---|---|---|---|---|
| Ceramic powder (mass %) | Alumina (flat) | 41 | 41 | — | — | — | 61 | 61 |
| | Mica (flat) | — | — | 30 | 30 | 30 | — | — |
| | Zirconia (indeterminate forms) | 12 | 12 | 10 | 10 | 10 | — | — |
| | Alumina (indeterminate forms) | — | — | 13 | 13 | 13 | — | — |
| Glass | | G9 | G10 | G11 | G12 | G13 | G1 | G1 |
| Average flexural strength (MPa) | | 230 | 240 | 210 | 190 | 190 | 250 | 260 |
| Water absorption (%) | | 0 | 0 | 0 | 0 | 0 | 8.8 | 3.1 |

TABLE 5-continued

| | | Ex. 15 | Ex. 16 | Ex. 17 | Ex. 18 | Ex. 19 | Ex. 20 | Ex. 21 |
|---|---|---|---|---|---|---|---|---|
| Size of flat fillers (cross section in thickness direction) | Average length of the major diameter (μm) | 2.5 | 2.5 | 5 | 5 | 5 | 2.5 | 2.5 |
| | Average length of the minor diameter (μm) | 0.08 | 0.08 | 0.14 | 0.14 | 0.14 | 0.1 | 0.05 |
| | Aspect ratio | 31 | 31 | 36 | 36 | 36 | 25 | 50 |
| Area ratio (%) | Alumina (flat) | 30.8 | 30.8 | — | — | — | 49.7 | 49.7 |
| | Mica (flat) | — | — | 30.3 | 30.3 | 30.3 | — | — |
| | Zirconia (indeterminate forms) | 5.8 | 5.8 | 5 | 5 | 5 | — | — |
| | Alumina (indeterminate forms) | — | — | 9.6 | 9.6 | 9.6 | — | — |
| Reflectance (%) | | 92 | 94 | 94 | 94 | 94 | 95 | 96 |
| Crystallinity of glass | | —*1 | —*1 | —*1 | —*1 | —*1 | —*1 | —*1 |

*1 crystallization peak other than peaks derived from the fillers was not measured.

As is evident from Tables 3 to 5, the substrates of Examples 1 to 19 wherein in the designated cross section of the glass ceramic body, the occupation area per unit area of the flat fillers having a major diameter of from 0.5 to 20 μm and a minor diameter of 0.02 to 0.25 μm was from 30 to 48%, had a high reflectance at a level of at least 83% and a high average flexural strength at a level of at least 180 MPa. Further, the substrates of Examples 1 to 19 had a water absorption of at most 1.5%, and thereby the formation of voids in each substrate was suppressed.

On the other hand, the substrates of Examples 20 and 21 containing such flat ceramic particles in such an amount that in the designated cross section, the occupation area per unit area of the particles was higher than 48%, had a high water absorption of at a level of at least 3.1%, and thereby the formation of voids in each substrate was observed.

INDUSTRIAL APPLICABILITY

According to the present invention, it is possible to provide a glass ceramic body wherein in the cross section in the thickness direction, flat fillers having the designated shape are contained in an amount within the designated range, whereby the formation of voids at the surface and in the inside are suppressed, and the deterioration of the strength is suppressed, and which has few voids in the inside and has a high reflectance.

Further, by using such a glass ceramic body, it is possible to provide a substrate for mounting a light emitting element and a light emitting device whereby a sufficient light emitting brightness can be obtained, the breakage at the time of mounting a light emitting element and the rupture at the time of cutting can be suppressed, and wherein defects such as connection defects due to the invasion a plating liquid into a substrate can be suppressed.

This application is a continuation of PCT Application No. PCT/JP2012/069751, filed on Aug. 2, 2012, which is based upon and claims the benefit of priority from Japanese Patent Application No. 2011-172889 filed on Aug. 8, 2011. The contents of those applications are incorporated herein by reference in its entirety.

REFERENCE SYMBOLS

10: glass ceramic body, 11: glass matrix, 12: ceramic particles, 20: light emitting device, 21: substrate for mounting a light emitting element, 22: light emitting element, 23: bonding wire, 24: sealing layer, 211: substrate base, 212: frame, 213: element connection terminal, 214: external connection terminal, 215: through hole conductor

What is claimed is:

1. A glass ceramic body comprising a glass matrix and flat fillers dispersed therein, wherein the flat fillers are dispersed in the glass matrix so that their individual thickness directions would be substantially in the same direction; and in a cross-section along the thickness direction of the flat fillers in the glass matrix, the occupation area of the flat fillers having a length in their flat direction of from 0.5 to 20 μm and a length in their thickness direction of from 0.02 to 0.25 μm per unit area of the cross-section is from 30 to 48%,
   wherein glass of said glass matrix is made of $SiO_2$—$B_2O_3$ glass comprising from 15 to 40 mol % of CaO as represented by oxides base.

2. The glass ceramic body according to claim 1, wherein the glass matrix is not crystallized.

3. The glass ceramic body according to claim 1, wherein in the occupation area of the flat fillers, the occupation area of the flat fillers having an average cross-sectional aspect ratio of at least 25 is from 30 to 48%.

4. The glass ceramic body according to claim 1, wherein in the occupation area of the flat fillers, the occupation area of the flat fillers having an average cross-sectional aspect ratio of from 25 to 80 is from 30 to 48%.

5. The glass ceramic body according to claim 1, wherein the flat fillers are made of at least one member selected from the group consisting of alumina, mica, silica and boron nitride.

6. The glass ceramic body according to claim 1, wherein when the glass ceramic body is formed into a flat plate having a thickness of 300 μm, the flat plate has a reflectance of at least 83% at a wavelength of 460 nm.

7. The glass ceramic body according to claim 1, which has a flexural strength of at least 180 MPa.

8. The glass ceramic body according to claim 1, wherein in said $SiO_2$—$B_2O_3$ glass $SiO_2$ is from 38 to 60 mol % and $B_2O_2$ is from 13 to 25 mol %.

9. The glass ceramic body according to claim 1, which contains $ZrO_2$ particles and wherein when the glass ceramic body is formed into a flat plate having a thickness of 300 μm, the flat plate has a reflectance of at least 90% at a wavelength of 460 nm and a flexural strength of at least 180 MPa.

10. A substrate for mounting a light emitting element, on which a light emitting element is to be mounted and which comprises the glass ceramic body as defined in claim 1.

11. A light emitting device comprising the substrate for mounting a light emitting element as defined in claim 10 and a light emitting element mounted on the substrate for mounting a light emitting element.

12. A glass ceramic body comprising a glass matrix and flat fillers dispersed therein, wherein the flat fillers are dispersed in the glass matrix so that their individual thickness directions would be substantially in the same direction; and in a cross-section along the thickness direction of the flat fillers in the glass matrix, the occupation area of the flat fillers having a length in their flat direction of from 0.5 to 20 μm and a length in their thickness direction of from 0.02 to 0.25 μm per unit area of the cross-section is from 30 to 48%, wherein said glass ceramic body comprises $ZrO_2$ particles and wherein when the glass ceramic body is formed into a flat plate having a thickness of 300 μm, the flat plate has a reflectance of at least 90% at a wavelength of 460 nm and a flexural strength of at least 180 MPa.

13. The glass ceramic body according to claim 12, wherein the glass matrix is not crystallized.

14. The glass ceramic body according to claim 12, wherein in the occupation area of the flat fillers, the occupation area of the flat fillers having an average cross-sectional aspect ratio of at least 25 is from 30 to 48%.

15. The glass ceramic body according to claim 12, wherein in the occupation area of the flat fillers, the occupation area of the flat fillers having an average cross-sectional aspect ratio of from 25 to 80 is from 30 to 48%.

16. The glass ceramic body according to claim 12, wherein the flat fillers are made of at least one member selected from the group consisting of alumina, mica, silica and boron nitride.

17. The glass ceramic body according to claim 12, wherein when the glass ceramic body is formed into a flat plate having a thickness of 300 μm, the flat plate has a reflectance of at least 83% at a wavelength of 460 nm.

18. The glass ceramic body according to claim 12, which has a flexural strength of at least 180 MPa.

19. The glass ceramic body according to claim 12, which is made of $SiO_2$—$B_2O_3$ glass containing from 15 to 40 mol % of CaO as represented by oxides base.

20. A substrate for mounting a light emitting element, on which a light emitting element is to be mounted and which comprises the glass ceramic body as defined in claim 12.

21. A light emitting device comprising the substrate for mounting a light emitting element as defined in claim 20 and a light emitting element mounted on the substrate for mounting a light emitting element.

* * * * *